United States Patent
Glushko et al.

(10) Patent No.: US 6,291,132 B1
(45) Date of Patent: *Sep. 18, 2001

(54) FLUORESCENT OPTICAL MEMORY

(75) Inventors: Boris Alexey Glushko, Ashdod; Eugene Boris Levich, Ramat Aviv, both of (IL)

(73) Assignee: Tridstore IP LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/531,888

(22) Filed: Mar. 21, 2000

Related U.S. Application Data

(62) Division of application No. 08/944,402, filed on Oct. 6, 1997, now Pat. No. 6,071,671.
(60) Provisional application No. 60/032,521, filed on Dec. 5, 1996.

(51) Int. Cl.[7] .............................. G11B 7/24; G11B 7/22; G11B 7/00
(52) U.S. Cl. ............................. 430/270.15; 430/270.15; 430/139; 430/321; 430/945; 369/275.3; 369/284; 369/288; 428/64.4
(58) Field of Search .................... 430/270.11, 270.15, 430/139, 321, 945; 369/275.3, 284, 288; 428/64.4

(56) References Cited

U.S. PATENT DOCUMENTS

| | | |
|---|---|---|
| 4,026,869 | 5/1977 | Evens et al. . |
| 4,030,926 * | 6/1977 | Stahlhe et al. ...................... 430/338 |
| 4,036,805 | 7/1977 | Tsujimoto et al. . |
| 4,090,031 | 5/1978 | Russell . |
| 4,163,600 | 8/1979 | Russell . |
| 4,219,704 | 8/1980 | Russell . |
| 4,864,536 | 9/1989 | Lindmayer . |
| 5,063,556 | 11/1991 | Chikuma . |
| 5,113,387 | 5/1992 | Goldsmith et al. . |
| 5,177,227 | 1/1993 | Fischer et al. . |
| 5,202,875 | 4/1993 | Rosen et al. . |
| 5,208,354 | 5/1993 | Fischer et al. . |
| 5,255,262 | 10/1993 | Best et al. . |

(List continued on next page.)

FOREIGN PATENT DOCUMENTS 60 127414  6/1985  (JP) .

OTHER PUBLICATIONS

Parthenopoulos, Dimitri A. et al., "Three–Dimensional . . . Memory," Sci., vol. 245, 843–845 (1989).

(List continued on next page.)

Primary Examiner—John A. McPherson
(74) Attorney, Agent, or Firm—Blank Rome Comisky & McCauley LLP

(57) ABSTRACT

The invention includes a method of manufacturing a fluorescent 3-D optical memory device implementing an active medium capable of storing information at high information density, and an optical memory device manufactured by this method. The active medium employed in the present invention is a material capable of existing in at least 2 isomeric forms. Transition from one form to another can be induced upon illuminating this material by a "writing" electromagnetic radiation having a first spectrum. At the same time the other isomeric form is capable of fluorescence upon illuminating this material by a "reading" electromagnetic radiation with a second spectrum. By virtue of illuminating with a radiation having the first spectrum there are created elemental cells within a medium material, containing substantially the same isomeric form thereof, which can be either that form which is capable of fluorescence or the other one which is not. The information is stored within the medium as numerical values associated with the amount of one of the isomeric forms of active medium contained within elemental cells distributed within the active medium.

48 Claims, 6 Drawing Sheets

U.S. PATENT DOCUMENTS

| | | |
|---|---|---|
| 5,268,862 | 12/1993 | Rentzepis . |
| 5,278,816 | 1/1994 | Russell . |
| 5,325,324 | 6/1994 | Rentzepis et al. . |
| 5,373,499 | 12/1994 | Imaino et al. . |
| 5,407,885 | 4/1995 | Fischer et al. . |
| 5,408,453 | 4/1995 | Holtslag et al. . |
| 5,465,238 | 11/1995 | Russell . |
| 5,472,759 * | 12/1995 | Chen et al. ............ 428/65.1 |
| 5,526,338 | 6/1996 | Hasman et al. . |
| 5,559,784 | 9/1996 | Ota . |
| 5,586,107 | 12/1996 | Best et al. . |
| 5,759,447 | 6/1998 | Efron et al. . |
| 6,071,671 * | 6/2000 | Glushko et al. ............ 430/270.15 |

OTHER PUBLICATIONS

Malkin, J. et al., "Photochromism . . . Naphthacenequinones," J. Am. Chem. Soc., 1994, 116, 1101–1105 (1994).

Sokolyuk, N.T. et al., "Naphthacenequinones: Synthesis and Properties," Russian Chem. Review 61(11), 1005–1024 (1993).

Gritsan, N.P. et al., "Kinetic Study of . . . 1–alkyl–9, 10–anthra–quinones," Russian J. of Phys. Chem. 64(11), 1660–1663 (1990).

Gritsan, N.P. et al., "Mechanism of Photochromic . . . Derivatives," J. Photochemistry and Photobiology, A: Chemistry, 52(1990) 137–156.

Gritsan, Nina P. et al., "Experimental and Theoretrical . . . 1–Methylanthraquinone," J. Am. Chem. Soc. 1991, 113, 9615–9620.

Irie, Masahiro et al., "Thermally Irreversible . . . Derivatives," J. Org. Chem., vol. 53, No. 4, 1988, 803–808.

Nakamura, Shinichiro et al., "Thermally Irreversible . . . Study," J. Org. Chem. 1988, 53, 6136–6138.

Irie, M., "Design and Synthesis of Photocheromic Memory Media," 1994.

* cited by examiner

FLUORESCENT OPTICAL MEMORY

REFERENCE TO RELATED APPLICATION

The present application is a division of U.S. patent application Ser. No. 08/944,402, filed Oct. 6, 1997, now U.S. Pat. No. 6,071,671, which claims the benefit of U.S. Provisional Application No. 60/032,521, filed Dec. 5, 1996.

FIELD OF INVENTION

The present invention relates to optical memory storage of digital information at high volume density of data. In particular the present invention refers to an optical memory device which employs a fluorescent medium, to a method of manufacturing such a memory device and particular construction thereof implementing said fluorescent medium.

BACKGROUND OF THE INVENTION

There is a growing demand for a cheap and reliable memory device for the storage of digital information for computers, video systems, multimedia etc. This device should have a data storage capacity in excess of $10^{11}$ bytes, fast access time, high transfer rate and long term stability. Today the capacity of available digital information storage means based on optical and magnetic methods is limited to about $5 \cdot 10^8$ bytes per square inch. Two-dimensional (2-D) memory devices such as optical and magneto-optical discs, magnetic discs and magnetic tapes are well known and represent most popular memory carriers for the storage of digital information. In optical 2-D memory devices the information is usually written as local variations of thickness, reflectivity, refractive index, or absorption coefficient of the medium. Storage devices, based on optical methods have advantages over magnetic ones because of less strict requirements of the components and environment. The possibility for parallel writing of information, i.e., simultaneous recording of information over the medium's surface, is another advantage of optical memory carriers, which is especially important for mass production. These carriers are usually formed as optical discs suitable for reading (CD-ROM) or write-once-read-many (CD-WORM) modes of operation. Their description can be found, for example, in *The Compact Disc Handbook* by Ken C. Pohlmann.

Unfortunately, the known-in-the-art two-dimensional optical memory devices have an important intrinsic disadvantage associated with the fact that their ultimate pixel capacity is diffraction limited by a factor of $1/\lambda^2$ where $\lambda$ is the wavelength of light employed in modern lasers. A certain increase in capacity can be achieved by special measures such as a "super resolution" at a fraction of a wavelength. However, implementation of this measure is associated with the necessity for very precise and sophisticated optical, mechanical and electronic equipment as well as in a high quality medium, which obviously makes this approach expensive and less feasible.

The main efforts to create a 3-D optical memory disc have been directed at developing of CD/CD-ROM-like optical devices, where reading is based on the modulation of a reflected beam. The modulation is the result of interference on the recorded pattern (pits) for CD/CD-ROM or variation of reflectivity for CD-R devices. The great advantages of this concept and method which has been developed since the 1970s by the electronic and computer community result in simple, reliable technology for the mass production of cheap optical carriers as well as pick-ups to play back the stored audio, video, and data information. A known method of improving the capacity of 2-D optical memory carriers is the stacking of two or more discs. The commercially available carriers implementing this approach are known as DVD's and are described, for example, in *Scientific American* July 1996. The disadvantage of this approach is associated with multiple reflections which occured between reflective surfaces, and led to power losses during the propagation of reading and reflected beams through the layers. The interference of light beams reflected from different layers results in beam distortions due to optical aberrations. The aberrations appear when the optical path within the storage media is changed to read different planes of stored information. High quality optical adhesives are required to assemble a stack of discs so as to reduce the influence of aberrations, bubbles, separations and inclusions and to ensure that there will not be any mechanical, thermal and chemical impact on the surface of the stacked discs. Due to the above mentioned requirements the information storage capacity of commercially available multistacked discs is limited in practice to $10^{10}$ bytes. These carriers are composed of 2 discs with 2 information layers in each. The DVD optical discs are attached together at their back sides, and it is possible to achieve a maximum total storage capacity of around $2 \cdot 10^{10}$ bytes.

An alternative method of optical data storage is based on three-dimensional (3-D) recording. It is obvious that 3-D recording can dramatically increase the storage capacity of the device. There are known-in-the-art 3-D recording methods, based, for example, on 3-D volume storage by virtue of local changes of the refractive index of optical media. The 3-D writing to and reading from the bulk media has been widely reported (J. H. Stricler, W. W. Webb, Optics Lett., 16, 1970, 1991; H. Ueki, Y. Kawata, S. Kawata, Applied Optics, 35, 2457, 1996; Y. Kawata, R. Yuskaitis, T. Tanaka, T. Wilson, S. Kawata, Applied Optics, 35, 2466, 1996). The operation of such device is based on using local changes of the refractive index of the optical media. These local variations of refractive index result in the birefiingence and variations of polarization of the reading beam transmitted through the media. The variations are detectable and can be interpreted as a binary code. Among the drawbacks of this approach is the very weak signal value requiring a high power laser and highly sensitive detectors. The 3-D regular structure of the information carrier acts as a birefringent material at a macro scale introducing the non informative depolarization and defocusing of the transmitted beam. Variations of the refractive index introduce the phase modulation located in the adjacent layers, diffraction and power losses. The measurement of the transmitted beam requires two optical heads (transmitting and receiving) from both sides of the caer. This solution is very complicated and expensive since it requires simultaneous alignment of the heads to a diffraction limited spot, especially while taking into account the variation of the required optical path, medium inhomogeneity, and carrier/heads movement perturbations. The data recording is possible only in a sequence fashion, bit by bit using a laser—thus, it does not allow the implementation of cheap replication methods, such as mask lithography. The solidification/polymerization process results in uncontrollable material deformation during the recording procedure. The associated stresses may cause information distortion. Thus, all the above-mentioned drawbacks will put obstacles in the way of converting this approach to be realized into the practical 3D-memory device.

There are different works and patents related to this field, e.g., J. Russell, U.S. Pat. Nos. 4,163,600; 4,219,704; 5,278, 816; and M. Best et al, U.S. Pat. Nos. 5,586,107; 5,255,262;. In order to provide a stable, reliable reading from different stacked discs, layers or surfaces, several methods have been invented, including layers with different reflective spectra, read by different wavelength lasers (Frisiem A. et al, U.S. Pat. No. 5,526,338), objective lens alignment from one layer to another (H. Rosen et al, U.S. Pat. No. 5,202,875), spherical aberration correction achieved simultaneously for different layer depth (W. Imaino, U.S. Pat. No. 5,373,499), changeable layer's transmission, reflectivity and/or polarization (J. Russell; U.S. Pat. No. 5,465,238), guide beam and scanned beam optical head configuration together with special guide plane utilization (A. Holtslag, U.S. Pat. No. 5,408,453). In Ota's patent U.S. Pat. No. 5,559,784 several methods of non fluorescent multilayer disc manufacturing are described, including mechanical, spin coating and photolithography techniques. A structure of multilayer optical discs is suggested, and a method of data recording in the form of refractive pits within a completely transparent material is described. This approach seems more advanced than the traditional methods using a whole reflective layer with the pits recorded as a reduction of reflection. It is stated that such a structure permits building of the multilayer disc which may be played back. However the diffraction and scattering on adjacent layers as well as birefringence are present in the disc reducing the signal to noise ratio and introducing crosstalk. Besides, the concept of pickup requires two laser sources and two optical heads which are placed on both sides of the carrier. This solution is rather complicated and difficult for implementation in a commercial device.

It should be pointed out that all multilayer data storage mediums based on the interference/reflectivity physical principles have very serious drawbacks which do not allow to provide more than two layers at high information density. An increase in amount of layers is possible only with dilution of area information density. This limits the multilayer disc capacity, which is close to DVD capacity. The data recorded on a CD/DVD disc is organized as a reflectivity variation on a data layer due to the interference between the light reflected from pit and land. Therefore, the contrast ratio for signal/noise or for "1" and "0" is limited by natural reasons (light spot size/pit size). While the layer reflectivity and thus the signal value should decrease as $S \sim n^{-2}$ with the number of layers n, the scattered light noise correspondingly increases as $N \sim n$; thus, the signal to noise ratio decreases as $S/N \sim n^{-3}$ with an increase in the number of layers n. The multiple reflection from different layers leads to multiple focuses, which obviously increases the crosstalk and reduces the signal. Furthermore, it is impossible to separate the useful signal light from the parasitic reflection and scattered light. All these drawbacks limit the practical realization of multilayer data storage down to only two layers promised by the DVD inventors and manufacturers. Further, it is difficult to expect that the great advantages of CD/DVD mass production technology based on the injection molding technique can be simply converted to fit the increased capacity multilayer disk manufacturing requirements.

Another alternative physical principle widely investigated since 1980 is based on the fluorescence phenomena. In the fluorescent memory storage the data is presented as local variations of fluorescent substance properties. The substance is illuminated with a radiation at excitation (reading) wavelength, and the fluorescence signal is registered at a different wavelength. A simple spectral filter can separate the fluorescent signal at a receiver from the noise of the excitation radiation. The fluorescent medium can provide a very high contrast ratio of $10^2$–$10^4$. The reading from a fluorescent disc is insensitive to the disc tilt. Fluorescent storage of data has a number of advantages which aid in overcoming the drawbacks of reflective, refractive and polarized memory and in building reliable, simple, cheap 3-D optical storage medium and optical head, which in principle will be much simpler than the existing CD drive.

Obvious shortcomings of the fluorescent principle are the low quantum yield of fluorescence and the low coupling efficiency of pickups.

Among the methods utilizing the fluorescence principle the most remarkable is the 3-D storage method and a rewritable optical memory based on the two-photon absorption process. This approach utilizes a fluorescent medium containing photochromic molecules capable of existing in two isomeric forms. The first isomeric form A is not fluorescent; it has absorption bands for UV radiation, and is capable of being transferred into the second isomeric form B upon the simultaneous absorption of two long wavelength photons. The second form B has an absorption band corresponding to the second harmonic of reading radiation and is capable of exhibiting fluorescence upon illumination by two photons of the reading light in the infrared range. This method is described in Peter M. Rentzepis' U.S. Pat. No. 5,268,862 where, as an active medium a dedicated photochromic material, i.e., spirobenzo-piran, maintained in a 3-D polymer matrix, is utilized.

The first disadvantage associated with 3-D memory as disclosed in Rentzepis' patent lies in the fact that the service life of the spirobenzopiran medium is limited because it is not stable at room temperatures. In order to suppress side reactions and to minimize so-called fatigue, which is defined as the gradual loss of the ability to change color after repeated "write" and "erasure" cycles, it should be stored at very low temperatures (–78° C.). The second disadvantage is associated with the fact that information is to be written into the medium by a two photon absorption process, where two beams should be crossed at a very small region having dimensions in the order of magnitude $\lambda^3$ ($\sim 1$ $\mu m^3$) The medium should be illuminated by two crossed beams of infrared reading radiation to induce the fluorescence. In order to fulfill this requirement each beam should be effected by picosecond or even femtosecond pulses of light so as to ensure that the intensity is sufficient for the writing and reading cycles. The required intensity is about $10^{10}$ W/cm$^2$. The picosecond/femtosecond lasers mentioned in Rentzepis' patent are Ti:Sapphire and Nd:YAG lasers, which are expensive devices and cannot be implemented into a cheap and compact memory setup.

It should be realized as well that illumination with two crossed beams necessitates their time synchronization so as to ensure proper overlapping of two beam pulses in space and time. In practice the optical system enabling the overlapping of two picosecond light pulses within the region of 1 $\mu m^3$ (and over app. $10^{10}$ pixels of carrier) is not available yet and therefore practical implementation of 2-photon absorption method in a form suggested by Rentzepis so far seems questionable.

Another problem associated with 3-D memory disclosed in Rentzepis' patent is the amount of time required for writing of information bit after bit into the disc. The required time is above $10^5$ sec or 25 hours, assuming feasible information writing rate of $10^6$ bits/sec and disc capacity of 10 GBytes. This apparently makes the disclosed 2-photon absorption method very expensive even for mass production.

In conclusion, it can be outlined that despite the known-in-the-art method of 3-D recording of information and an optical memory based thereon, nevertheless, this method does not seem a feasible one, nor is it suitable one for industrial implementation.

There are several patents describing the 2-D and 3-D multiple data layer fluorescent media structure and several methods of manufacturing such media.

The first patent describing the idea of a multilayer optical memory structure was issued to Russel, U.S. Pat. No. 4,090,031, where the possibility of using a fluorescent medium for data reproducion has also been briefly mentioned. However, in contrast to our invention, in this patent the data layers have no spacing, and they should be composed from different fluorescent materials. Furthermore, the patent requires equal track and light spot widths. The patent does discuss the required information layer structure, which is essential for multilayer memory. Furthermore, it neither describes the method of such memory manufacturing, nor the principle of operation or design of proper pickup which allows for selective reproduction of the data from such a structure. It is especially important for the multilayer memory where the interlayer crosstalk and proper selectivity means are the major problems to be solved. Consequently, the patent does not disclose practical methods for building a fluorescent 3D memory.

In Miyadera's patent No. JP 05-2768 the two data layer optical recording medium is described. These recording layers contain two different color fluorescent substances having non overlapping absorption and fluorescence bands. It allows each layer to be read separately; however, it requires a complicated optical head and complicated, if at all feasible, manufacturing process. The manufacturing process is not described.

In Chikuma's U.S. Pat. No. 5,063,556 the fluorescent recording medium is suggested where the single layer information pattern is formed from the islands of fluorescent material between a transparent substrate and reflective layer. This structure is not suitable for multilayer discs because the layer is not transparent. Moreover, the method for the formation of such fluorescent islands is not described.

OBJECT OF THE INVENTION

The object of the present invention is to provide a method for manufacturing of a 3-D optical memory and a 3-D fluorescent optical memory carrier, a method in which the above mentioned drawbacks associated with known-in-the-art solutions are sufficiently reduced or overcomed, without losing their inherent benefits.

In particular, the first object of the present invention is to provide a new and improved method of manufacturing a 3-D optical memory, by implementing a fluorescent medium which enables both writing and reading cycles without the necessity of 2-photon illumination of the medium by two crossed laser beams.

The second object of the present invention is to provide a new and simple method for manufacturing a 3-D optical memory carrier, which utilizes a single photon illumination which can easily be accomplished by means of available low power diode lasers.

A further object of the present invention is to provide a new and efficient method for manufacturing a 3-D optical memory carrier which enables simultaneous parallel 2-dimensional writing over the entire surface of the medium.

Still a further object of the present invention is to provide a new and improved 3-D optical memory device which does not require storage at low temperatures and has an improved storage capacity remaining over many reading cycles.

Yet another object of the present invention is to provide a new 3-D optical memory device with improved storage capacity by virtue of recording of a variable amount of information bits within a diffraction limited volume (pixel or bit) of the fluorescent medium.

SUMMARY OF THE INVENTION

The above and other objects and advantages of the present invention can be achieved in accordance with the combination of its essential features, referring to different embodiments thereof. The invention includes a method of manufacturing a fluorescent 3-D optical memory device implementing an active medium capable of storing informationn at high informnation density and an optical memory device, manufactured by this method. The active medium employed in the present invention is a material capable of existing in at least 2 isomeric forms. Transition from one form to another can be induced upon illuminating this material by a "writing" electromagnetic radiation having a first spectrum. At the same time the other isomeric form is capable of fluorescence upon illuminating this material by a "reading" electromagnetic radiation with a second spectrum. By virtue of illuminating with a radiation having the first spectrum there are created elemental cells within a medium material; containing substantially the same isomeric form thereof, which can be either that form which is capable of fluorescence or the other one which is not. The information is stored within the medium as numerical values associated with the amount of one of the isomeric forms of active medium contained within elemental cells distributed within the active medium. By virtue of the present invention the amount of a particular form of the medium can be changed and so the numerical values associated therewith. The amount of an isomeric form within an elemental cell can be defined either by the concentration of molecules which depends on the amount of molecules within the cell or by the dimensions of the cell, which, in turn, are limited by the diffraction of illuminating radiation. The refractive index of the cell is to be equal to the refractive index of the information layer; thus diffraction is reduced to the minimum. The stored information can be picked up from the memory device by illuminating the active medium with the "reading" radiation. This radiation induces fluorescence from one of isomeric forms, and one can read the stored information by registering the amount of induced fluorescent radiation which does not interact with the medium material, and passes all multilayer structures without distortion. No. noise or crosstalk are introduced in the fluorescence radiation regardless of the medium thickness or amount of fluorescent layers. illuminating by "writing" or "reading" electromagnetic radiation can be effected by a single laser beam having different power and/or spectra of wavelengths required for either the writing or the reading cycle. In a simplified solution writing and reading radiation can be performed at one wavelength as well.

The concentration of fluorescent molecules within elemental cells can be changed during illuminating by "writing" radiation in a few ways. The first method is based on increasing the concentration of fluorescent molecules in the medium material, which should satisfy the following criteria. The first isomeric form A of the medium material should have strong absorption of "writing" radiation and should be converted thereby into the second isomeric form B. The first isomeric form A should not fluoresce when illuminated by the "reading" radiation. The concentration of the form A should be substantially higher than the initial concentration of form B when no information is stored. The second form B should be relatively stable under illumination by the writing radiation and should have low absorption thereof, however, it should have strong absorption of reading radiation followed by fluorescence and should be able to exhibit fluorescence upon illumination.

The second method for changing concentration of medium material within elemental cells is based on decreasing the concentration of fluorescent molecules upon illumination by the writing radiation. Here the molecules, which are fluorescent upon illumination by the reading radiation are initially presented in the medium. The concentration of these molecules is decreased during selective illumination by writing radiation with short wavelength or high power causing bleaching of the medium material within certain elemental cells exposed to the radiation. This "written" structure consists of a plurality of elemental cells containing a high concentration of medium material, which is no longer fluorescent. Another "written" structure can be obtained by the same process. This structure contains elemental cells with a high concentration of the fluorescent molecules. The cells are surrounded by areas of medium material which is no longer fluorescent. The second structure is preferable for 3D fluorescent memory.

The fluorescent 3D optical memory device manufactured in accordance with the present invention can be implemented in any available form, for example, as an optical disc, optical memory card, optical memory plate, optical memory tape, or optical memory drum (cylinder) etc. However, for the sake of brevity a further disclosure of the present invention will refer to the manufacture of an optical disc ordy.

The information is recorded and stored within elemental cells as an increased or reduced amount of fluorescent isomeric form, correspondingly capable of producing a variable amount of fluorescence, increased or reduced. The elemental cells are situated along adjacent tracks, which can be organized in parallel layers within a multilayered "sandwich" structure thus providing a 3-D memory device with increased storage capacity. The monolayer or multilayered structure is fixed on a carrying substrate and is covered with a protective layer. The adjacent layers within the multilayered structure are divided therebetween by intermediate layers without active medium.

In accordance with the present invention there are two methods of illuminating with writing radiation for storing information within a single layer. The first method is suitable for mass production of discs containing stored information—so-called CD-ROM-type discs. The information is written in these discs by simultaneous selective illumination of the entire layer surface. This can be carried out by illuminating the medium surface via a mask produced by available microlithography technologies. The mask can be produced by using the equipment for compact disc/digital video disc production, a so-called "laser beam recorder". This premastered mask has a desirable layer pattern. The mask is illuminated by short wavelength radiation which is projected on the layer using submicron resolution objectives. The mask can be holographic, providing a desirable pattern of the layer on a required distance (10–200 microns) to the mask without use of projection objectives. A set of masks can be used to produce a multilayered disc. Each "written" layer is covered with a transparent interlayer material for reading radiation and for fluorescence radiation. However, it is not transparent for writing radiation. The thickness of the fluorescent layers should be 0.5–3 $\mu$m, and that of the intermediate non fluorescent layers should be 10–100 $\mu$m.

The layers are mastered one by one, each illuminating step being followed by coating of the information layer by an intermediate layer and then by coating with a new layer containing the medium material which is ready for the following illuminating step. It is preferred to match refractive indexes of the adjacent layers to prevent an interference effect therebetween. The interlayer material can be any suitable material having strong absorption of the writing radiation so as to ensure that the intensity thereof is reduced during propagation of the writing radiation through the interlayer material, and thus already written information layers will not deteriorate.

The information layers can be manufactured separately each on its own transparent substrate. The substrate thickness should be 10–200 microns. The substrates with "written" information layers can be coated with thin protective transparent coating and then bonded together thus forming the multilayer fluorescent disc.

The second method of illuminating with writing information is based on a selective point-by-point illumination of the medium material starting from the first layer, which is closest to the source of writing radiation. In this case the material within the intermediate layers should be transparent for writing radiation. The average transmission of the first fluorescent layer increases after the information is recorded, and writing within the second information layer can be effected. A WORM (write once read many) optical memory disc can be manufactured in this way.

A combination of the first and second illuminating methods permits the manufacture of a disc having the advantages of both discs, i.e., a disc already recorded by the manufacturer containing information, written within the first layers, and still having storage capacity within the rest of layers for recording information by the user itself In accordance with the present invention different medium materials having different absorption spectra can be used in the design of the disc. By using different medium materials one can use layers having dissimilar absorption or/and fluorescence spectra, which in turn should permit increased information density storage and thus increased storage volume of the disc. The increase of storage will be proportional to the amount of different spectra being used. Another advantage of using medium materials with dissimilar absorption spectra is the possibility of increasing the spacing between fluorescent layers operating at one spectral range and thus achieving more reliable reading due the reduced disturbance from the adjacent layers.

The above explained writing methods can be implemented either with initially non fluorescent or initially fluorescent medium material. Accordingly the pattern of the mask for illuminating the initially non fluorescent material should be a negative of the pattern of the mask used for illuminating the initially fluorescent material.

An important issue in optical memory devices is the orientation (tracking) support means. For the 3-D optical memory device manufactured in accordance with the present invention it is not recommended that the traditional "lands and groves" approach be used because this complicates the manufacturing process. It is here suggested to create a support tracking means by virtue of fluorescence of the medium material, i.e., to create tracks by recording them similarly to the information to be stored. The pattern for tracking support means can be achieved in different ways. For example, it can be formed as a combination of spiral or concentric lines of the fluorescent material recorded within information layers so as to be separated from elemental cells, or to be superimposed therewith. It is also possible to use the elemental cells themselves as tracking support means. For this purpose the spacing between the cells should be smaller than the spacing between adjacent tracks. The last method is especially suitable when elemental cells are equally spaced, and each cell contains many bits of information, their numerical values associated with the amount of fluorescent molecules within cells. All the above mentioned patterns are applicable to the situation when there is a deviation (wobbling) of the tracking support means from the central line at a certain spatial frequency. This spatial frequency (spatial modulations) can be converted into a modulated electric signal during reading of the information from the disc, even before the information is converted to a digital code. The electric signal produced can be used to define the pickup position on the disc.

The above described above manufacturing methods permit production of readable multilayer fluorescent discs with 100 and more fluorescent layers. The information capacity of such a disc can reach about $10^{12}$ Bytes.

Alternative feasible types of 3-D optical fluorescent memory devices, which can be manufactured in accordance with the present invention include carriers such as optical plates and optical cards, etc. They are different from the described mulilayered memory disc by the geometry of the carrier, driver mechanisms and by the concept of positioning of the pickup head with respect to the carrier. Nevertheless, the structure of layers with stored information can be the same as described above with reference to the multilayered disc.

The present invention in its various embodiments has only been briefly summarized. For better understanding of the present invention and its advantages, reference will now be made to the following description of its embodiments taken in combination with accompanying drawings.

DESCRIPTION OF THE PREFERRED EMBODIMENTS

Figure 1:
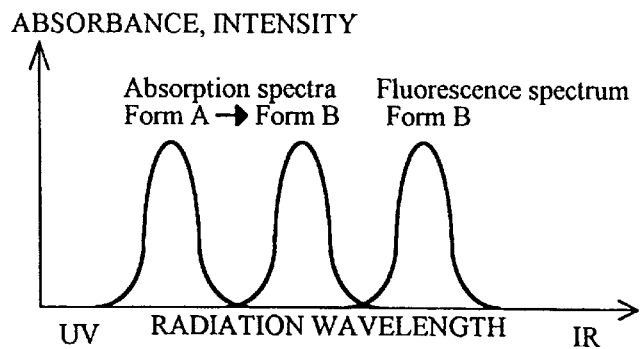
FIGS. 1 and 2 schematically show the absorption and fluorescent spectra of different medium materials suitable for use in 3-D optical memory devices.

With reference to FIG. 1, here are schematically shown the absorption and fluorescent spectra of a medium material suitable for the 3-D optical memory device in accordance with the present invention. It is shown that this material can exist in isomeric forms A and B, one of which is fluorescent. It can be seen that in order to effect the transition of one isomeric form into another one, a short wavelength electromagnetic radiation is required with approximately UV or visible spectrum, while for inducing the fluorescence within one of the isomeric forms a long wavelength electromagnetic radiation is required with approximately visible or IR spectrum.

Figure 2:
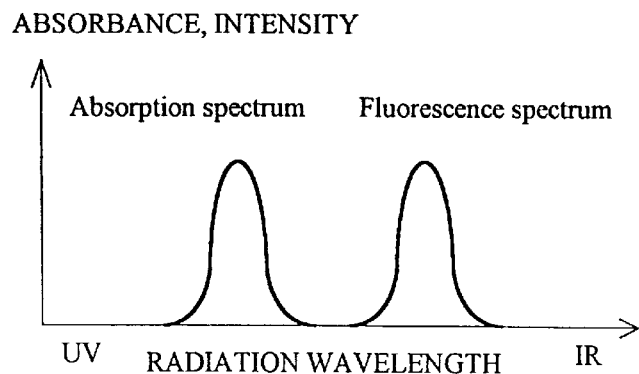

In FIG. 2 the absorption and fluorescent spectra of another type of medium material are shown. They are also suitable for the 3-D optical memory device in accordance with the present invention, said material existing only in one fluorescent isomeric form. Fluorescence can be induced in this form by a long wavelength electromagnetic radiation in the visible or IR spectrum. By illuminating this material with short wavelength electromagnetic radiation in the UV or visible spectrum it is possible to convert this material into another non fluorescent form. In further discussion, the electromagnetic radiation, inducing fluorescence within the active medium material will be referred to as a first or "reading" radiation. The electromagnetic radiation inducing transition between isomeric forms of the same medium material or converting a fluorescent form into a non fluorescent one will be referred to as a second or "writing" radiation. A suitable medium material for use in 3-D optical memory here is either a chemical substance capable of exhibiting induced fluorescence when taken alone, or one being distributed and maintained within a suitable matrix, for example, a polymeric matrix.

In contrast to the prior art of 3-D memory devices which also implement fluorescent medium materials which require illumination with two crossed focused femtosecond/picosecond high power laser beams, it is sufficient, in accordance with the present invention, to illuminate the medium by only a single beam of electromagnetic radiation, produced by a low power diode laser. It has been shown experimentally, that irreversible transfer from the non fluorescent isomeric form of an active material to the fluorescent isomeric form is achieved by illumination of a thin layer of this active material with a single beam of lower power laser radiation. It has also been found that this transfer is induced by a one-photon absorption process. In accordance with the present invention the preferred range of radiation is 350–700 nm.

Figure 3:
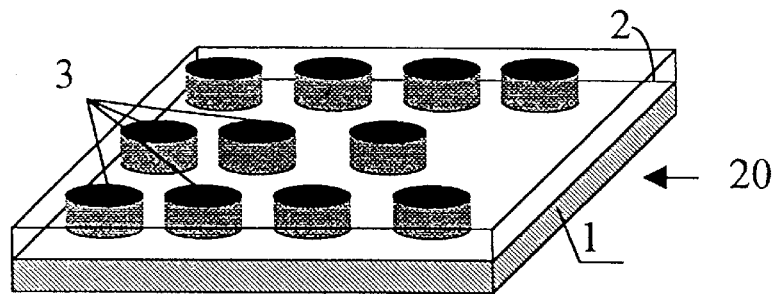
FIG. 3 shows the distribution of elemental cells over the surface of a layer of active medium.

It has also been found that illumination of the medium material by a single low power beam of UV or visible radiation is accompanied by the creation of a fluorescent isomeric form distributed within the layer as a plurality of elemental cells, containing molecules of the fluorescent isomeric form. The size of the elemental cells corresponds to the dimensions of the beam spot, to which the active medium was exposed during illumination. With reference to FIG. 3 one can see one of the preferred embodiments of 3-D optical memory 20, consisting of a substrate or base layer 1, coated by a working layer 2 with active medium capable of existing in two isomeric forms, one of which is fluorescent upon illumination by a first, preferably IR electromagnetic radiation. Molecules of fluorescent isomeric form are concentrated within elemental cells 3 upon illumination of layer 2 by a second, preferably UV electromagnetic radiation.

As an example of the medium material having the appropriate absorption spectrum, matching the above range of the first and second radiation one can mention polymethilmethacrylate which contains 2,3-dimethyl-1,3-diphenyl-5, 12-naphthacenequinone and pyrolidine.

The amount of fluorescent isomeric form within the elemental cells depends on the amount of second radiation; in other words, on the time of exposure and/or on the intensity thereof. By varying of these factors one can control the amount of the same isomeric form within each cell and thus the information associated therewith. By proper choice of the amount of second radiation, one can ensure that the amount of fluorescent isomeric form within the elemental cells will be either one of two ultimate values or it will be one of a plurality of numerical values. In the first case the two ultimate values referring to the amount of fluorescent medium within the elemental cells will be associated with binary code values. In the second case the variable amount of fluorescent form will be associated with continuous numerical values. This possibility of storing information within the active medium as continuous numerical values expands the storage capacity of such memory device.

In another preferred embodiment the active medium consists of a material, capable of existing only in one isomeric form, which is fluorescent under illumination by a first radiation. In order to record information therein, the medium is illuminated by a second radiation so as to cause local "bleaching" thereof due to transfer into the non-fluorescent form or distraction. As in the previous case illumination of the medium by a different amount of second radiation will be accompanied by the creation of elemental cells containing a different amount of fluorescent form. The total amount of fluorescence of the medium and so the information associated therewith will correspond to the amount of remaining fluorescent form. Described below is how a suitable medium material can be prepared.

The information carrying material is a mixture of a fluorescent dye, a solvent, a host material and a photosensitive component. The fluorescent dye is one of the following: Carbazine 122, Pyridin 1, Nile Blue, DQOCI, Rhodamine 6G, Rhodamine 800, DCI-2, Styryl 6, Oxazine 750, DTDCI, Phenoxazon 9. The dye names are according to Lambdachrome Laserdyes of Lambda Physics. The listed dyes are appropriate for excitation with 630–650 nm laser diodes, as used in DVD pickups. Longer wavelength diodes require longer wavelength dyes. Rhodamine 6G, Rhodamine 800, Oxazine 170, Oxazine 1, Oxazine 750 were used in the prototyping experiments.

Short wavelength dyes (blue and green excitation) are utilized when excitation is provided at a short wavelength. The excitation can be provided using light emitting diodes (LEDs) and/or lamps which are the most economical and reliable solutions for blue/green high density discs today.

The suitable solvent can be acetone, n-hexane, ethanol, propanol, toluene and the like, depending on the solubility of dyes and host material as well as on the viscosity of the host material. Viscosity of the mixture and resulting fluorescent layer thickness depends on the amount of solvent in the mixture. The named solvents were used in the experiments, showing the advantages of mixtures containing acetone.

The host material interacts with the dye to provide efficient conversion of absorbed radiation into the fluorescence. This is due to the spatial separation of the fluorescent components preventing the reaction of excited and non excited centers, the narrowing of spectral lines, the increasing of excited states effective life time and enhancement of cross-section transitions. Examples of the host materials used are photoresists, acrylic lacquers, UV adhesives, optical polymers. The same materials without florescent dye were used for binding the multilayer fluorescent discs, when layers were produced separately layer by layer as well as when multilayer fluorescent disc were produced from a set of double sided layer fluorescent sheets.

The photosensitive materials are high speed photo polymers providing high sensitivity and developing characteristics. The photosensitive materials also produce, under UV illumination, free radicals which interact with the dyes, resulting in the bleaching of dyes.

It has been found that it is advantageous if the range of second "bleaching" electromagnetic radiation lies within the 350–550 nm range for writing over all the disc area during the disc manufacturing and within the 500–800 nm range for writing using a single laser beam in a disc drive for storing user information.

Figure 4:
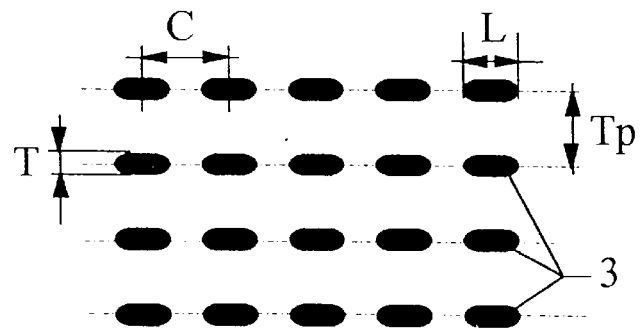
FIG. 4 shows the preferred pattern of distribution of elemental cells over the surface of an active medium.

With reference to FIG. 4 there is shown the pattern of distribution of elemental cells 3 over the surface of the medium and dimensions of elemental cells. It is preferable if the cells are formed as tiny "pits" distributed in rows along concentric circles or spirals forming tracks. Concentric rows or spiral revolutions are separated by a distance Tp of about 1500 nm (Track pitch). The longitudinal dimension L of elemental cells (extension along the row) can be 0.4–4 $\mu$m depending on the information encoding method employed for "reading". The transversal dimension T of elemental cells (extension across the row) can be about 0.5 $\mu$m. The depth dimension (extension within the layer with active medium) can be about 3 $\mu$m. It is advantageous if the track pitch Tp exceeds the average longitudinal dimension L by approximately 2–3 times. The center-to-center distance C between adjacent cells is about 1–2 $\mu$m.

In order to read out such a multilayer structure it is preferable if the cells containing molecules of fluorescent form cover only 10–20% of the total layer area, while the remaining 80–90% of the layer are transparent: For the same reason the reading light absorption in the cells should be in the range of 5–30%. As a result, the absorption of information layer for non focused light shall be 1–10%, which is by order of magnitude less than the absorption of focused light in the cells. A significant part of absorbed reading radiation is located in a cell at the focus of reading beam. A non significant part of absorbed reading radiation is located in a plurality of the cells out of focus of reading beam, and this part is distributed over all cells. Consequently, fluorescence of a cell in the focus of reading beam is much stronger (about $10^3$ times) then the fluorescence of any cell out of focus of the reading beam. The disclosed structure permits reading of individual cell of fluorescent memory device consisting of 100 layers and more. The confocal scanning microscope reading principle can be used for reading of such a structure. Moreover, calculations and experimental results have shown that the requirements for the confocal aperture size can be significantly simplified.

Figure 5:
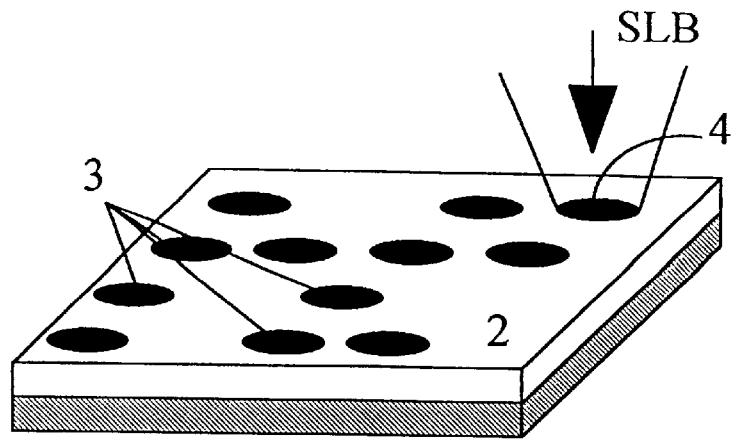
FIG. 5 schematically shows the illumination of the medium effected in point by point mode.
Figure 6:
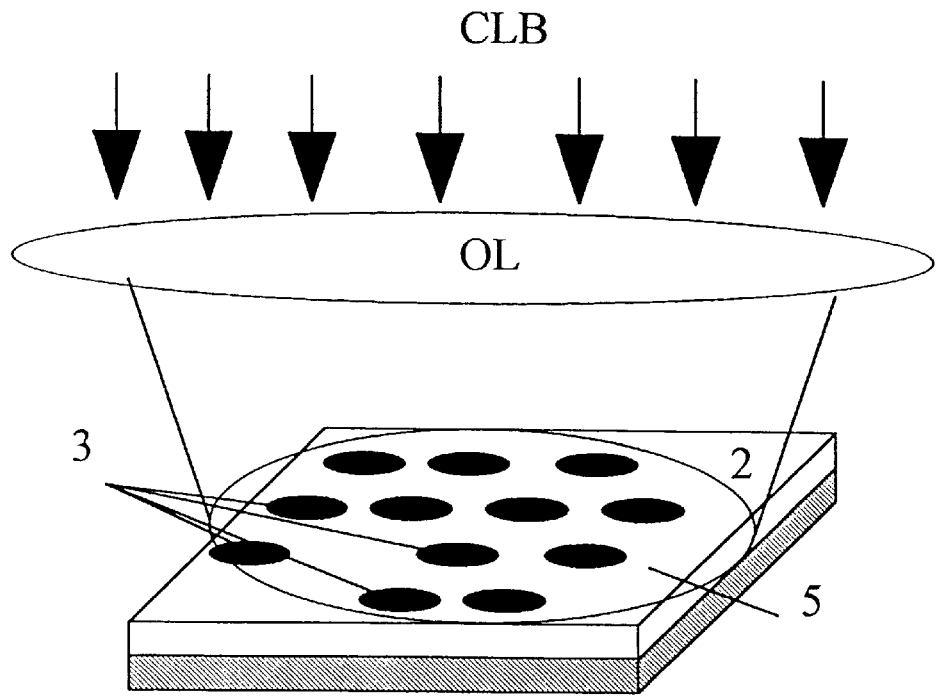
FIG. 6 schematically shows the illumination of the medium effected over the entire surface thereof FIG. 7 schematically shows the distribution of elemental cells within the medium, said cells having a high or low amount of a fluorescent isomeric form related, correspondingly, to one of two ultimate binary values.

Two different methods of recording information by the second radiation are illustrated in FIGS. 5, 6. In FIG. 5 the single laser beam SLB, produced by a lower power diode laser (not shown) is focused in a selected location 4. An elemental cell is created in this exposed location, containing substantially the same form of the medium, which is either the fluorescent isomeric form or bleached non fluorescent one depending on the medium material and spectrum of illuminating radiation. After illuminating of location 4 the single laser beam SLB is moved by an appropriate driving means (not shown) into another position so as to illuminate another selected location of the layer surface. Consequently, the entire surface of the layers will be occupied by elemental cells 3, distributed thereon in accordance with a certain preselected pattern, corresponding to point-by-point pattern of movement of the laser beam.

In FIG. 6 another possibility for illuminating the medium surface enabling simultaneous creation of a plurality of elemental cells containing the same form of medium material is shown. In this case the collimated laser beam CLB consisting of plurality parallel single beams lying in the same plane is directed from an appropriate mask (not shown) to the surface 5 of layer 2 by means of an objective lens OL. The mask defines the distribution of illuminating radiation at the layer surface, so as that only certain locations of the layer's surface are exposed to the illuminating radiation. During illumination the elemental cells are created, and are arranged over the layer surface in accordance with the mask pattern. It should be realized that the mask and objective lens functions can be performed by a single optical element—the holographic mask. The holographic mask alone converts the collimated laser beam into the desired illumination radiation distribution at the layer surface. The elemental cells can be arranged over the layer surface in accordance with the pattern which was used for manufacturing of the holographic mask.

In both cases the transfer from one form of medium to another is induced by virtue of one photon mechanism induced by a second radiation.

Figure 7:
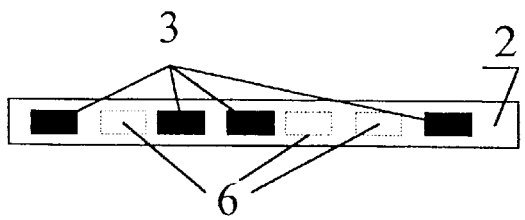

With reference to FIG. 7 it is schematically shown that after selective illumination of the photosensitive medium with "writing" or "bleaching" radiation there is created a sequence of elemental cells 3 generally containing the same isomeric form (fluorescent or non fluorescent, respectively) interspersing with unexposed locations 6 containing the initially present isomeric form (non fluorescent or fluorescent, respectively). It can be revealed that the information recorded within such medium is presented by binary values. One of these values is associated with fluorescent or bleached form within elemental cells 3 and the other binary value is associated with bleached or fluorescent isomeric form within unexposed locations 6.

Thus, by using different spectra of second radiation and/or by using different exposure time and/or by using different intensity of second radiation one can control the amount of that form of the medium, which is created within the individual elemental cell.

Figure 8:
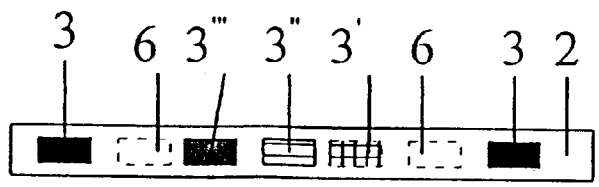
FIG. 8 schematically shows the distribution of elemental cells within the medium, said cells having variable amounts of the fluorescent isomeric form related to different numerical values.
Figure 9:
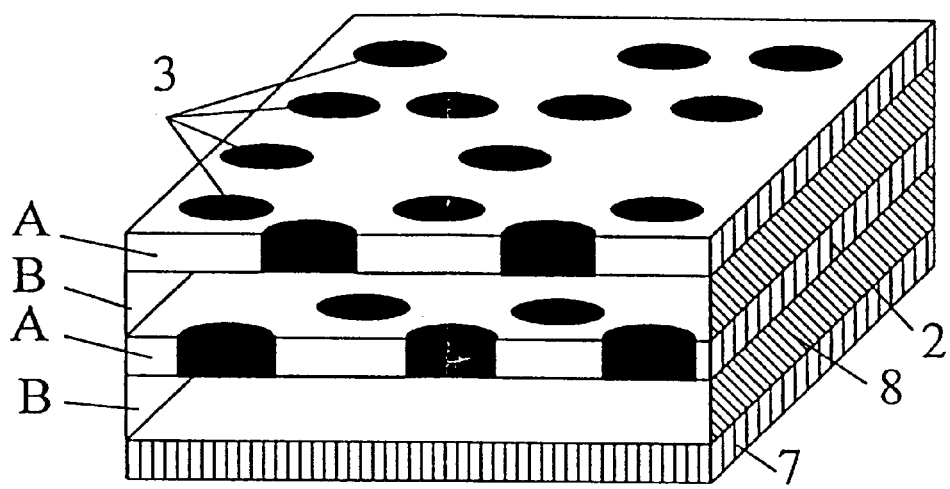
FIG. 9 schematically shows the 3-D fluorescent optical memory device implemented as a multilayered disc structure in accordance with the present invention.

With reference to FIG. 8 it is shown that after illuminating layer 2 by a second radiation there are created elemental cells 3, 3', 3", 3'" containing different concentrations/amounts of fluorescent isomeric form or bleached non fluorescent form. The cells are interspersed with unexposed/exposed locations 6, which contain non fluorescent or fluorescent isomeric form of the medium. It is clear that after illumination of selected areas of the information layer either fluorescent cells are produced within the nonfluorescent layer or nonfluorescent cells within the fluorescent layer.

The variable amount of particular form created within different cells can be associated with different numerical values. It can be readily realized that the amount of information recorded within the medium is significantly increased in comparison with the previous situation, where the information was presented only by binary values.

In accordance with the present invention it is possible to achieve especially high density of information storage if illumination with writing radiation is carried out via objective lenses with the numerical aperture of about NA=0.5–0.9. Such a high value of numerical aperture is required to ensure that diffraction limited dimensions of elemental cells will be comparable with the wavelength of writing radiation. Another advantage of using objective lenses with high numerical aperture is small waist length of focused radiation. By virtue of illumination carried out via objective lenses with the above numerical aperture it is possible to ensure a very small thickness of layers with active medium storing recorded information. In practice this thickness can be kept within approximately 0.5–3 $\mu$m.

Practical implementations of the present invention are illustrated in FIGS. 9–14.

It is advantageous to manufacture the fluorescent 3D optical disc as follows: A plastic or glass disc 7 is used as a substrate or a base for the multilayered structure. The thickness and diameter of base disc should correspond to those of available optical discs, for example, a diameter of 120 mm and thickness of less than 1.2 mm. The multilayered structure is formed on the substrate in succession, layer after layer. The substrate is covered by a conventional technique with transparent non fluorescent layer 8 consisting of a high quality optical material. Layer 8 has a thickness in the range of 10–50 $\mu$m, preferably being 15–30 $\mu$m. The appropriate material for this layer can be optical polymer such as an optical polycarbonate, optical polyimide, optical silicone adhesive, optical UV adhesive or optical lacquers. Examples of a suitable optical polymer are Macrolon® CD 2005/MAS130, Macrolon® DP 1-1265, Macrofol® DE 1-1 of Bayer AG or Duramid® of Rogers Corp., Ultem® of GE Plastics, AI-10® of Amoco etc.

The transparent layer is covered by a first layer A consisting of a fluorescent medium material. The layer has thickness of 0.5–3$\mu$m. As a suitable material for the fluorescent layer one can use the same optical polymer as for layer 8 but with a fluorescent additive distributed therein, for example, the fluorescent dyes described above.

It is advantageous if the refractive index of the fluorescent layer is matched with that of transparent layer 8. The first fluorescent layer is illuminated via a mask by a second radiation. It is also advantageous if the mask is a holographic one. In this case the mask is placed in proximity to the fluorescent layer. If the mask is an amplitude mask it should be placed between the source of radiation and the projection lens. In both cases the desired distribution of the second radiation is provided at the surface of the fluorescent layer. It is advantageous to distribute the second radiation inside the fluorescent layer. Elemental cells 3 with stored information are formed upon illumination. The cells are arranged over the layer in accordance with the pattern of the mask.

For example the mask can be projected on the layer surface by an available non contact photolithography technology utilizing a pre mastered mask. It is advantageous if one mask is used for manufacturing of many discs, thus reducing the cost of manufacturing. It has been empirically found that in order to achieve efficient writing of information, the average value of absorption of the fluorescent medium material at the reading wavelength should be about 10–60% before writing; the average transmission of the fluorescent layers at the reading wavelength should be about 90–99% after writing.

After illuminating the first fluorescent layer A is covered by a second non fluorescent layer B which is deposited similarly to the first non fluorescent layer 8. The second non fluorescent layer B is transparent to the fluorescence emitted by layer A and is preferably non transparent to the second radiation. It is advantageous if the average values of absorption of the fluorescent layer and of non fluorescent layer at writing wavelength are about 90–100%.

The next layer deposited on layer B is a second fluorescent layer A, which is covered by a third non fluorescent layer B (not shown) and this sequence is repeated as many times as required by the total amount of information to be recorded. The last non fluorescent layer is covered by a protective layer (not shown) against mechanical and/or environmental damage.

Figure 10:
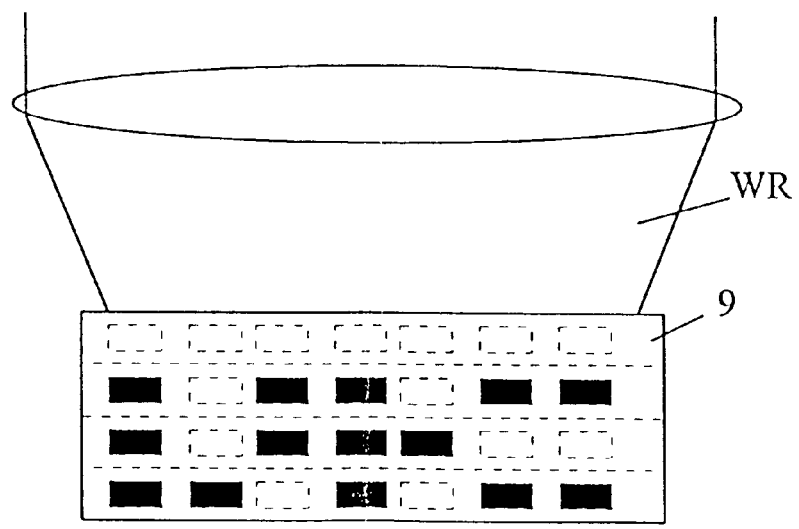
FIG. 10 shows the method of production of the multilayer structure shown in FIG. 8.
Figure 11:
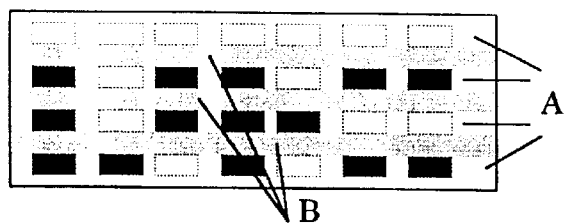
FIG. 11 schematically shows the 3-D fluorescent optical memory device implemented as a multilayered disc consisting of layers with the active fluorescent medium separated by intermediate layers.

With reference to FIGS. 10 and 11 it is schematically shown that recording of information by means of writing radiation WR takes place in succession, i.e., information is recorded in the current layer only after it has already been recorded in the layer situated therebeneath.

Thus, by utlizing the above described sequence of steps the 3-D memory device, formed as a multilayered "sandwiched" structure, is obtained. This structure consists of a plurality of fluorescent layers A carrying the recorded therein information and divided therebetween by a plurality of intermediate non fluorescent layers B. The intermediate layers have strong absorption of "writing" radiation in order to prevent the deterioration of information in the lower layers during recording in the upper layers.

Each intermediate layer in fact can be considered as a substrate for the next fluorescent layer to be arranged thereon or as a protective layer if there is no need in more fluorescent layers. Thus the whole structure can be obtained by repeating the main sequence of steps, i.e., coating a substrate by a layer containing an active medium illuminating a layer with an active medium by a single beam of electromagnetic radiation so as to transfer one form of the medium into the other covering the illumninated layer with a protective layer.

Figure 12:
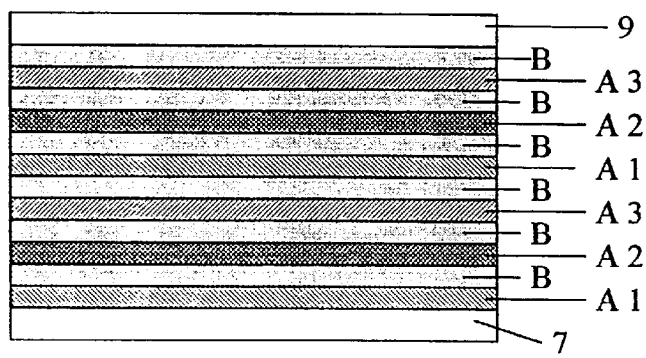
FIG. 12 schematically presents the 3-D fluorescent optical memory device in accordance with the present invention formed as a multilayered disc consisting of layers with dissimilar active medium.

The fluorescent layers can consist of the same medium material or be made from dissimilar medium materials. This situation is schematically shown in FIG. 12, where one can see a stack of fluorescent layers made of different medium materials A1, A2, A3 supported by substrate layer 7 and divided therebetween by intermediate layers B. The whole structure is covered by protective layer 9.

Figure 13:
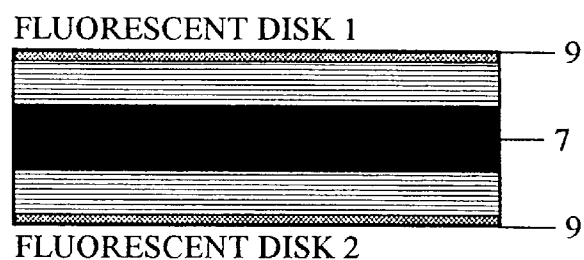
FIG. 13 shows an alternative embodiment of the 3-D fluorescent optical memory device formed as two attached discs in accordance with the present invention.
Figure 14:
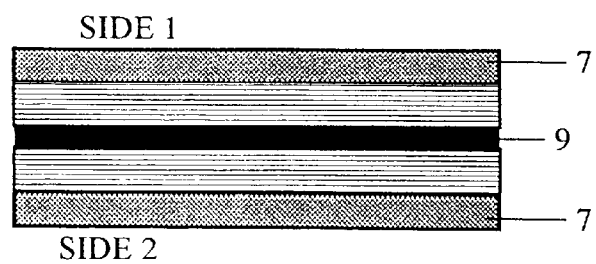
FIG. 14 shows an additional embodiment of the 3-D fluorescent optical memory device formed as a double sided disc in accordance with the present invention.

FIGS. 13, 14 show how the capacity of an optical memory device manufactured in accordance with the present invention can be increased. For this purpose two already made discs can be attached to each other by their substrate sides 7 having protective coatings 9 at opposite surfaces (FIG. 13) or two already made discs can be attached to each other by their protective coating sides 9 while having transparent substrate sides 7 at opposite outer surfaces (FIG. 14).

It might be advantageous if at least part of the disc area is allocated for storing of information at the manufacturer facility. The other areas can be reserved for storing of information by the user himself. Elemental cells at these areas should contain maximal or minimal concentration of fluorescent isomeric form depending on the medium material and/or spectrum of illuminating radiation (possibility for "bleaching" or for inducing fluorescence). For example, the area allocated to the user contains cells with a maximal concentration of fluorescent form. The fluorescence can be reduced selectively in some of these cells by bleaching; thus, recording of user information is effected.

Figure 15:
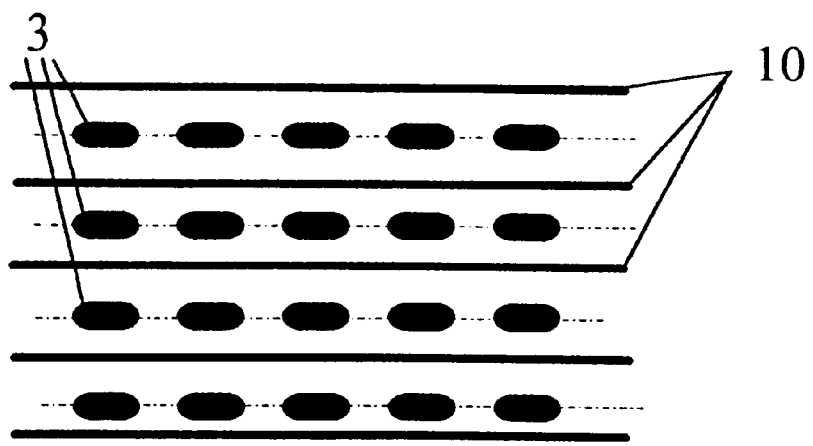
FIG. 15 schematically presents a pattern of distribution of tracking support means separated from the elemental cells.
Figure 16:
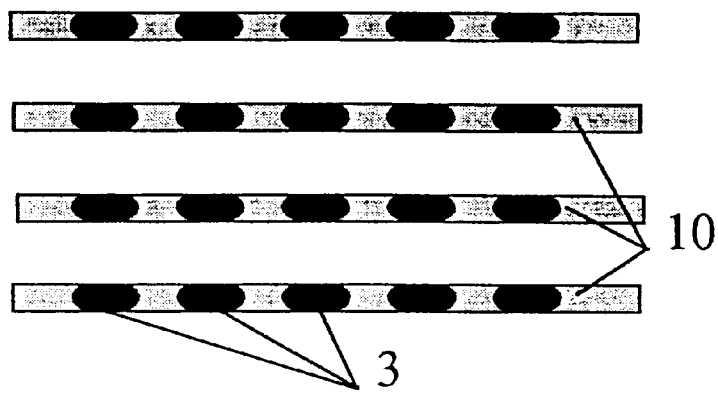
FIGS. 16 and 17 present different patterns of distribution of tracking support means superimposed with the elemental cells.
Figure 17:
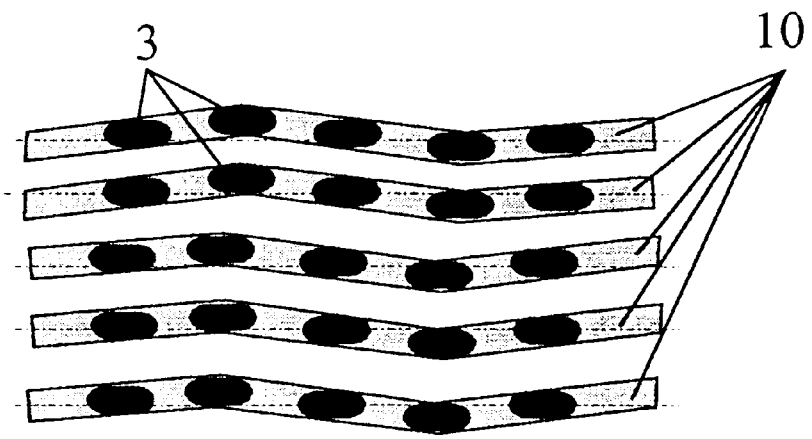

It is also advantageous if the fluorescent layer contains information associated with track error detection, as is shown in FIGS. 15–17. This auxiliary information can be arranged on the layer surface in accordance with several patterns. This information can be located along concentric or spiral lines 10 and can be separated from the elemental cells 3 with stored information (FIG. 15), or to be superimposed therewith (FIGS. 16, 17). Fluorescent lines 10 at FIG. 15 enable tracking in the case where a local absence of cells is caused by specific information distribution. Fluorescent lines 10 in FIG. 16 ensure the constant component of fluorescent signal to always be above zero; this improves tracking reliability. Fluorescent lines 10 and fluorescent elemental cells 3 are placed in wobbled fashion along the track; thus producing a modulated signal by tracking components of the reading pickup. This modulated signal has a low frequency as compared with the data signal, and it is used to define position on the disc in advance to decoding of the data signal.

Figure 18:
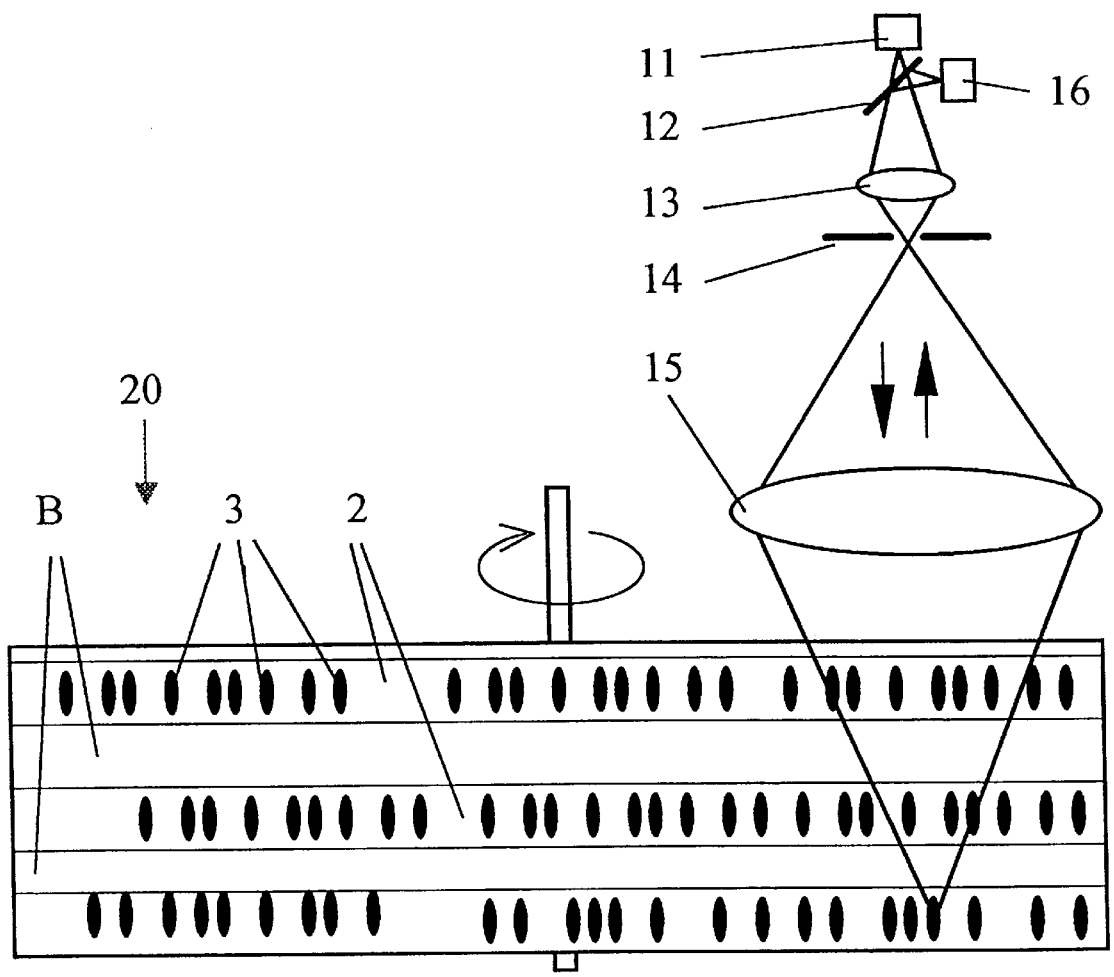
FIG. 18 schematically presents a reading apparatus for the 3D fluorescent memory device.

With reference to FIG. 18 a reading apparatus for 3D fluorescent memory device is shown. It includes source of reading/writing radiation 11, which might be a laser diode, a lamp, a light emitting fiber or the like. A dichroic beam splitter 12 and optical system 13 are placed between the source of radiation 11 and aperture 14. The dichroic beam splitter 12 shown in FIG. 18 is transparent for the reading radiation and is reflective for the fluorescence radiation. The dichroic beam splitter 12 can be a dichroic mirror, an optical wedge, a hologram, a fibers coupler/splitter or the like. An objective lens 15 is placed between the aperture 14 and a 3D fluorescent memory device 20, which is shown as a multilayer fluorescent disc for simplicity. The objective lenses 13, 15 can be conventional optical systems made of lenses and mirrors or they can be modern optical devices like holograms, integrated optics and the like. Fluorescent cells 3 of the information layer 2 of the memory device 20 are adjusted to be at the working distance ("in focus") of the lens 15. The optical system of the lens 15 can be adjustable for various working distances to read from many layers 2 and to compensate for spherical aberrations. Aperture 14 is placed at the second working plane of the objective lens 15. Receiver 16 is placed aside of the dichroic beam splitter 12 at the second working plane of the objective lens 13. The receiver 16 can be a photodiode, a photomultiplier tube, a photon counting device, a multielement photodiode array, a position sensitive photodiode and the like.

It is clear for someone skilled in the art that the functions described above can be performed by a different combination of optical elements without changing the idea of the described embodiments. For example, lens 13 and beam splitter 12 can be replaced by a holographic dichroic lens. Another example is when elements 12–15 are replaced by a holographic dichroic lens, and source 11 and receiver 16 have diffraction limited dimensions of optical interfaces.

The operation of the memory disc manufactured in accordance with the present invention will now be described.

The Disc Operation

The information is picked up from the disc by virtue of a dedicated pickup means, which is disclosed in our copending patent application U.S. Ser. No. 60/03260 herein incorporated by reference. The rotating disc is illuminated by a first radiation, which is focused into a small spatial volume having dimensions of about 1 μm. This reading radiation is absorbed by fluorescent cells, and thereby induces the fluorescence, which is registered by the receiver unit of the pickup means. The fluorescence value corresponds to the amount of fluorescent medium within the illuminated cell, and this value is converted into a digital code by appropriate electronic components of the pickup means. Since the distance between adjacent pits along the track is smaller than the track pitch, the pickup means is capable of sensing the tracking error. The track pitch is larger than the reading spot diameter, so tracking errors cause reduction of the induced fluorescence signal from its maximal value (the spot is at central line of the track) down to nearly zero (the spot is between the tracks). The amplitude of the signal is reduced when the beam of reading radiation is focused not at the center of the track. It also follows that when this beam is not aligned with the central line of the track, the amount of fluorescence received by sensors of the pickup means is different. A similar error detecting procedure is supported by the disc for focusing error correction. The spacing between the fluorescent layers is large compared to fluorescent layer thickness and the reading beam confocal parameter. The beam diameter is increased out of focus, and intensity of the reading light is reduced out of focus. Reduced intensity provides the reduced fluorescence. Consequently, the fluorescent signal is reduced when the reading beam is focused out of fluorescent layer plane, thus providing the information for focusing error correction.

It is advantageous if the fluorescent 3-D multilayer disc also contains auxiliary information referring to the local parameters of the layer, including, for example, the layer and track address, maximal and minimal values of pits, and timing synchronization. This information is written sufficiently frequent over all the disc so as to allow fast access and search of information on the disc, autocalibration, accurate analog-to-digital conversion or auto correction of timing circuits.

A fluorescent multilayer disc containing dissimilar fluorescent medium materials shall be read by plurality of pickup means, each reading at a dedicated wavelength. The pickup means shall provide for selective excitation for different absorption spectra of fluorescent materials and/or selective reading of different fluorescence spectra corresponding to different medium materials. The selectivity can be provided in various ways, for example, using multiple emitters/receivers operated at different wavelengths, using tunable emitters/receivers, or using tunable filters in front of wide band emitters/receivers.

Operation of an illustrative reading device, which is shown in the FIG. 18, is explained below. Reading radiation of the source 11 is passed through the dichroic beam splitter 12 and is focused by the optical lens 13 onto the small aperture 14. The aperture serves as a spatial filter, and passed radiation is close to the diffraction limited. The optical lens 15 concentrates this reading radiation into a single fluorescent cell 3 of an information layer 2 of the multilayer fluorescent disc 20. The reading radiation is converted into fluorescence radiation according to the amount of fluorescent material in the cell 3. Some small fraction of the reading radiation is absorbed in the upper layers of the disc. The fluorescence is collected by the lens 15 onto the aperture 14. Radiation emerging from the cell in the focus of the lens 15 passes the aperture 14 without losses, and the fluorescence from other cells is rejected by the aperture. Lens 13 projects the fluorescence light from the aperture 14 on the dichroic beam splitter 12. The beam splitter 12 reflects the light onto the receiver 16. The receiver 16 generates output electrical or light signals which are correlated with the fluorescence signal and with the amount of fluorescent material in the cell 3. Focusing and tracking error signals are generated when the fluorescent cell 3 and data layer 2 are not in the focus of the lens 15. This is because the fluorescence is reduced when fluorescent cell 3 is out of focus, and consequently, is illuminated with reading radiation of reduced intensity. In addition, a smaller fraction of fluorescence radiation passed the aperture 14 when the fluorescent cell 3 is out of the focus of lens 15. Additional information on focusing and tracking errors is provided when the receiver 16 is multisegmented or position sensitive. Change of position of the fluorescent cell 3 provides changes in the distribution of fluorescent light at the receiver 16.

Results of experimental verification of the present invention are now disclosed.

The first medium material was tested for the absorption spectra of isometric forms A and B, the material being applied to a glass substrate as a single layer, having a thickness of 5 μm. The tested material was a polymethil-methacrylate film containing 2,3-dimethyl-1,3-diphenyl-5,12-naphthacenequinone and pyrolidine.

A writing procedure was performed using two different methods. The isomeric form A was transformed into the isomeric form B under the UV light illumination at a wavelength of 0.5 μm. The absorption spectra, fluorescence spectra, efficiency of fluorescence, contrast and other parameters have been measured. The He—Ne laser beam at 630 nm was used for reading. The transmission of coated plate for the He—Ne laser light (630 nm) was decreased from 97% to 83% during writing (compensated for the Fresnel losses). The induced fluorescence was increased 11 times during writing. Fluorescence efficiency was measured to be 24% for the elemental cells with increased concentration of the form B. The low fluorescent efficiency was explained by low purity of material used in this experiment. Efficiency can be improved using the industrial grade pure material and appropriate wavelength laser diode for the excitation.

The second method was contact photo printing using UV radiation and a mask. The contact photo printing on the fluorescent layer was used for producing parallel fluorescent lines of 4 μm width, which was determined by the resolution of the method and of the mask.

The second medium material was tested using bleaching of fluorescent molecules by the UV and visible light radiation thus reducing the amount of fluorescence centers within the elemental cells. The material used was a mixture of dissolved fluorescent dye and of an optical lacquer. The material was applied to a glass substrate by spin coating as several layers having thickness of 0.3–1 μm or 20–30 μm. The number of layers (10 to 30) was coated one upon another, resulting in the multilayered structure. The absorption and fluorescence properties were measured. The absorption of a 1 μm thick layer was 10% as required for the optimized 3D fluorescent disc under illumination with a red He—Ne laser at the wavelength of 630 nm.

The quantum efficiency of the fluorescence was measured to be nearly 1. The fluorescence was registered using a pin Si photo diode, providing a stable and strong signal of 1 V amplitude at 1 mV noise level. The efficiency of the pickup collector used in the experiments was intentionally 100 times lower than the efficiency of a conventional pickup, which can be used for reading the multilayer fluorescent disc. This shows that Carrier to Noise ratio was more than 40 dB even in this simple and nonoptimized experiment.

The first writing method was based on the bleaching of fluorescent molecules with the UV light. The layer was covered by a mask for a contact photo printing using UV light. A pattern consisting of a plurality of lines having a width of 4 μm and spaced by 4 μm was written onto the layer. The pattern structure and dimensions were defined by the mask resolution.

The second writing method was based on laser writing. Recording of information within fluorescent layers was carried out by the laser illumination and resulted in cells with longitudinal dimension L of 1 μm and track pitch Tp of 2 μm. A four-layer disc was prepared in this way. Spacing between layers was 0.1 mm in this preliminary experiments. The stored information was read using parallel reading, when 900 pits (3600 μm$^2$) were picked up at ones using a Pulnix CCD camera. The fluorescent image produced by the disc was projected using a microscope having the magnification of 400 times onto the CCD Si array. The image height was 60 μm at the disc plane or 240 pixels at the CCD array plane (4 pixels of the CCD per micron at the disc). The measured contrast of the fluorescent image was 3, signal to noise ratio was 100. Each fluorescent layer was accessed without measurable crosstalk from other layers. The reading was performed more than $10^{10}$ times without any measured degradation of the pattern. The above results confirm that by virtue of the present invention 3-D stable fluorescent optical memory can be manufactured.

Information was written into the memory using He—Ne laser illumination at the wavelength of 630 nm. The information was picked up from the memory by virtue of low power red laser, providing excellent signal and carrier to noise ratios.

As it has been shown by virtue of the present invention it is possible to manufacture a 3-D optical memory carrier by means of single photon illumination of the medium material. The illumination can be effected very easily by available low power lasers and writing of the information can be performed over the entire surface of the medium. The memory device manufactured in accordance with the present invention has improved storage capacity, the information is stored within a diffraction limited volume of the medium and can be represented either as a binary or as a numerical value. The information carrier manufactured in accordance with the present invention is convenient in use since it utilizes medium materials which do not require storage at low temperatures, and its storage capacity does not deteriorate after many cycles of recording and reading.

The scope of the present invention is defined in the appended claims.

The features disclosed in the foregoing description, in the following claims and/or in the accompanying drawings may, both separately and in any combination thereof, be material for realizing the invention in diverse forms thereof

We claim:

1. A method for manufacturing optical 3-D memory for information storage, said method comprising the following main sequence of steps:
   a)—coating of a substrate by a layer containing an active medium comprising a material existing either in
      a first form, which is fluorescent upon illumination thereof by a single beam of a first electromagnetic radiation, or existing in
      a second form, which is not fluorescent upon illumination thereof by said first electromagneticradiation, wherein transfer from one form to another can be effected by a one-photon absorption process by illuminating said material by a single beam of a second electromagnetic radiation defined by a spectrum different from the spectrum of said first radiation;
   b)—illuminating said layer containing an active medium by said second electromagnetic radiation so as to create within said active medium a plurality of elemental cells distributed in different locations within said medium and containing said first or second form of said material, said elemental cells being allocated for an information to be stored; and
   c)—covering said layer containing an active medium with a protective intermediate layer;
      said optical 3-D memory comprising aplurality of said layers containing said active medium separated by said protective intermediate layers.

2. The method as defined in claim 1, in which said illuminating is effected so as to create within said active medium elemental cells containing the same form of said material, wherein the amount thereof varies from one elemental cell to another.

3. The method as defined in claim 2, in which the amount of said material within an elemental cell corresponds to one of two ultimate values, each of said ultimate values being associated with a binary code value.

4. The method as defined in claim 2, in which the amount of said material is associated with various numerical values.

5. The method as defined in claim 1, in which said material is capable of existing in at least two isomeric forms, wherein the fluorescence of one of the said isomeric forms can be induced upon illumination thereof by said first radiation, and transfer from one isomeric form to another can be induced by said second radiation.

6. The method as defined in claim 5, in which illuminating by said second radiation is associated with creating elemental cells containing mainly the fluorescent isomeric form of said material.

7. The method as defined in claim 5, in which illuminating by said second radiation is associated with creating elemental cells containing mainly the non fluorescent form of said material.

8. The method as defined in claim 1, in which illumination by said first radiation is associated with the reading of information to be stored and illuminating with said second radiation is associated with the writing of information to be stored.

9. The method as defined in claim 1, in which illumination of said layer is effected so as to distribute said elemental cells in accordance with a preselected pattern over the surface of said layer.

10. The method as defined in claim 9, in which said illumination is effected over the entire surface of said layer via a mask.

11. The method as defined in claim 1, in which said protective layer comprises a substrate, and said main sequence of steps is resumed at least once so as to obtain at least two layers with an active medium, said layers being divided therebetween by an intermediate layer.

12. The method as defined in claim 1, comprising creation within said layer with active medium of an information pattern associated with track error detection.

13. The method as defined in claim 12, in which said information pattern associated with track-error detection is created simultaneously with illuminating of said layer by said second electromagnetic radiation.

14. The method as defined in claim 12, in which said information pattern associated with track-error detection is created so as to separate thereof from elemental cells associated with the information to be stored.

15. The method as defined in claim 12, in which said information pattern associated with track-error detection is created so as to superimpose thereon with elemental cells associated with information to be stored.

16. The method as defined in claim 1, in which at least one of said layers contains an active medium which is dissimilar with an active medium associated with the rest of the layers.

17. The method as defined in claim 1, in which said layers with an active medium have a thickness of 0.5–5 $\mu$m, and said intermediate layers have a thickness of 5–100 $\mu$m.

18. The method as defined in claim 1, in which the refractive index inside the fluorescent cells and outside is essentially the same.

19. The method as defined in claim 1, in which said layers with an active medium have refractive indices, which are matched.

20. The method as defined in claim 1, in which at least one of said layers with an active medium has absorption spectrum, differing of absorption spectra associated with the rest of layers.

21. The method as defined in claim 1, in which said elemental cells are defined by a longitudinal dimension not exceeding 0.6 $\mu$m, and by a depth extension within the respective layer with an active medium not exceeding 3 $\mu$m.

22. The method as defined in claim 1, in which the elemental cells contain the same isomeric form of said material, wherein the amount thereof varies from one elemental cell to another.

23. The method as defined in claim 1, in which the elemental cells contain the same isomeric form of said material, wherein said cells are defined by a various depth extension within the respective layer of said active medium.

24. The method as defined in claims 1, in which the elemental cells containing the same isomeric form of said material are defined by various longitudinal dimensions.

25. The method as defined in claim 1, wherein said layers carrying information to be stored are formed by a spin coating technique.

26. The method as defined in claim 1, wherein said intermediate layer is produced by a spin coating technique.

27. The method as defined in claim 1, wherein a first one of the plurality of layers with the active medium is formed on said substrate.

28. The method as defined in claim 1, wherein a second one of the plurality of layers with the active medium is formed on the top of a first intermediate layer.

29. The method as defined in claim 1, where said active medium comprises at least one dye, chosen from the group including organic laser fluorescent dyes and inorganic dyes.

30. The method as defined in claim 1, where the fluorescence quantum efficiency of said active medium lies within the range of 30–100%.

31. The method as defined in claim 1, where said intermediate layer comprises at least one material chosen from the group including: UV resin, positive/negative photoresist, PMMA, polycarbonate, polyamid, polysterene, polyurethane.

32. A method as defined in claim 1, wherein said elemental cells are produced by a photolithography means comprising exposure of said active medium to UV radiation via a mask.

33. The method as defined in claims 1 in which said layer with information to be stored includes an information pattern associated with address detection.

34. A 3-D optical memory comprisisng
a)—a substrate; and
b)—a plurality of layers each containing an active medium material existing either in a first form, which is fluorescent upon illumination thereof by a single beam of a first electromagnetic radiation
or existing in a second form, which is not fluorescent upon illumination thereof by said first electromagnetic radiation, wherein transfer from one form to another can be effected by a one-photon absorption process by illuminating said material by a single beam of a second electromagnetic radiation defined by a spectrum differing of the spectrum of said first radiation.

35. The 3-D optical memory as defined in claim 34, in which said layers contain the same active medium.

36. The 3-D optical memory as defined in claim 34, in which at least one of said layers contains an active medium which is dissimilar with an active medium associated with the rest of the layers.

37. the 3-D optical memory as defined in claim 34, in which said layers with an active medium are separated by intermediate layers and have a thickness of 0.5–3 $\mu$m, and said intermediate layers have a thickness 5–100 $\mu$m.

38. The 3-D optical memory as defined in claim 34, in which said active medium has elemental cells formed therein, and in which said elemental cells are distributed substantially over the respective surfaces of said layers and are arranged thereon in accordance with a certain pattern.

39. The 3-D optical memory as defined in claim 34, in which said layers have matching refractive indexes.

40. The 3-D optical memory as defined in claim 34, in which said active medium has elemental cells formed therein, and in which said elemental cells have a longitudinal dimension not more than 0.6 $\mu$m and extend not more than 3 $\mu$m within each respective one of the layers.

41. The 3-D optical memory as defined in claim 34, in which at least one of said layers has absorption spectra, differing from the absorption spectra associated with the rest of the layers.

42. The 3-D optical memory as defined in claim 34, said memory constituting a CD-ROM.

43. The 3-D optical memory as defined in claim 34, said memory constituting a CD-WORM.

44. The 3-D optical memory as defined in claim 34, said memory constituting a tape.

45. The 3-D optical memory as defined in claim 34, said memory constituting a card.

46. The 3-D optical memory as defined in claim 34, said memory constituting a cylinder.

47. The 3-D optical memory as defined in claim 34, in which said layer is provided with a track error detection means.

48. The 3-D optical memory as defined in claim 34, in which said layer is provided with an information pattern associated with address detection.

* * * * *